Oct. 24, 1967

B. E. BRILEY 3,349,252

MINORITY CARRIER STORAGE FLIP-FLOP

Filed March 16, 1964

INVENTOR.
BRUCE E. BRILEY

BY
C A Gullbrandsen
ATTY.

3,349,252
Patented Oct. 24, 1967

3,349,252

MINORITY CARRIER STORAGE FLIP-FLOP

Bruce E. Briley, La Grange Park, Ill., assignor to Automatic Electric Laboratories, Inc., Northlake, Ill., a corporation of Delaware Filed Mar. 16, 1964, Ser. No. 351,999
4 Claims. (Cl. 307—88.5)

ABSTRACT OF THE DISCLOSURE

A bistable flip-flop circuit including a single transistor having minority storage capabilities. An A.C. source is connected to the base of the transistor via a diode switch connected to the collector. When becoming forward biased, due to the transistor assuming its conductive state upon the application of a momentary pulse to a control lead, the diode switch effectively connects the A.C. source to the base and the sine wave injects a sufficient number of minority carriers into the transistor to maintain it in the conducting state. Upon receiving a second momentary control pulse, the transistor cuts off, reverse biasing the diode switch and effectively blocking the sine wave from the base. A D.C. source connected directly to the base of the transistor then maintains the transistor in its cutoff state. A bistable flip-flop circuit of this general type may be used as a neutron radiation detector. In this case, the above-mentioned second pulse is replaced by the impingement of neutrons on the transistor.

Figure 1:
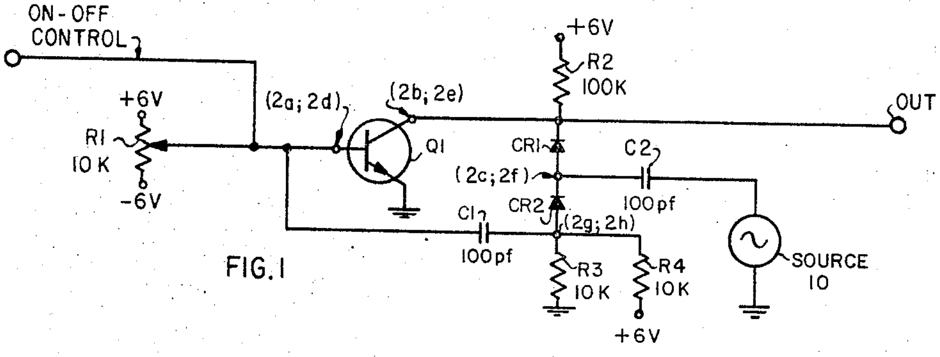

This invention relates to transistor flip-flop circuits and more particularly to flip-flop circuits of the minority carrier storage type.

The conventionally used flip-flop or two state multivibrator circuit employs two transistors with D.C. coupling from the collector of one transistor to the base of the other and vice versa.

A flip-flop requires a voltage gain and a current gain and a logical gain. A grounded emitter transistor is qualified to produce voltage and current gain, but the inherent signal inversion quality of a grounded emitter circuit has frustrated attempts to produce a flip-flop using one transistor to achieve the necessary logical gain with the exception of the point contact transistor flip-flop and the flip-flop blocking-oscillator type circuit.

A single point contact transistor is able to achieve two states because of its negative resistance, but its use for this purpose has been abandoned because of the difficulty in producing uniform point contact transistors.

For economy reasons the blocking oscillator type flip-flop circuit is rarely used since it is necessary to employ a transformer.

The principal object of the invention is to provide a flip-flop circuit comprising a single junction-type transistor in an arrangement which does not include a transformer.

Another principal object of the invention is to provide a flip-flop circuit with two states opposite in polarity to each other.

Still another object of the invention is to utilize the minority carrier storage phenomenon of semiconductors in an arrangement for a radiation detector.

A feature of the invention is to apply the collector following phenomenon and the minority carrier storage phenomenon of semiconductors which occurs under certain conditions that will be discussed, to achieve a flip-flop circuit.

U.S. Patent No. 3,113,296, G. H. Perry et al., describes electronic circuits employing one transistor having two-states and utilizing the principle of carrier storage. In Perry et al. a feedback circuit is used which includes a transformer connected between collector and base of a transistor. When the transistor is in the ON state, the proper transformer operation is dependent upon the synchonization of pulses on the primary and secondary side. The invention herein, in a single embodiment thereof, applies the carrier storage principle in a much simpler arrangement comprising diodes and a signal source producing sinusoidal signals which are modulated to the transistor base when the diodes are forward biased.

In addition, the instant invention teaches the collector following effect when the transistor is storing minority carriers which is especially useful in obtaining two states that are opposite in polarity to each other. Copious literary effort has been expended upon the behavior of the collector voltage (or current) when a transistor is abruptly cutoff after saturation. In each case (e.g., Alvin B. Phillips, Transistor Engineering (New York: McGraw-Hill Book Co., Inc., 1962). p. 330), the collector voltage and current are shown to remain unchanged for a time when the emitter-base junction is reverse biased. While this description is approximately correct in most cases, it is grossly in error under certain conditions.

According to an embodiment of the invention described below, the flip-flop comprises a single transistor, an input circuit biasing the transistor to a first state until an external signal changes the transistor from the first state to a second state, a switch including unidirectional devices connected from the collector to the base of the transistor for providing a high impedance from collector to base when the transistor is in the first state and a low impedance when the transistor is in the second state, a signal generator producing sinusoidal signals connected to the switch and finding a low impedance path to the base when the switch is at a low impedance, and a resistive means being connected to the collector of the transistor; the resistive means with the frequency and amplitude of the varying signal determining the voltage level of the second state which could be set to a voltage opposite in polarity to the voltage of the first state. In the second state, the sinusoidal signal modulated to the input of the transistor saturates and cuts off the transistor. When the transistor is saturated, a large number of minority carriers are injected into the base region and are stored during cutoff to cause the collector voltage to follow the base voltage to a level near or below the base voltage. Before the stored carriers are lost via recombination with opposite polarity carriers or through collector current flow, the transistor is saturated to inject more carriers for storage. The continuous saturation and cutoff of the transistor maintains a constant average voltage. If a plurality of flip-flop circuits were used in a system, a single source could be used for all.

Other objects and a fuller understanding of the invention may be had by referring to the following description, taken in conjunction with the accompanying drawings in which:

FIG. 1 is a schematic of the one transistor flip-flop arrangement;

FIGS. 2*a* to 2*h* indicate the wave forms of the flip-flop during its two states. FIGS. 2*a*, 2*b*, 2*c* and 2*g* show the flip-flop "0" state at the base, collector, junction of diodes CR1 and CR2, and the junction of CR2, R3, R4, and C1, respectively; FIGS. 2*d*, 2*e*, 2*f*, and 2*h* show the same points for the "1" state.

Figure 3:
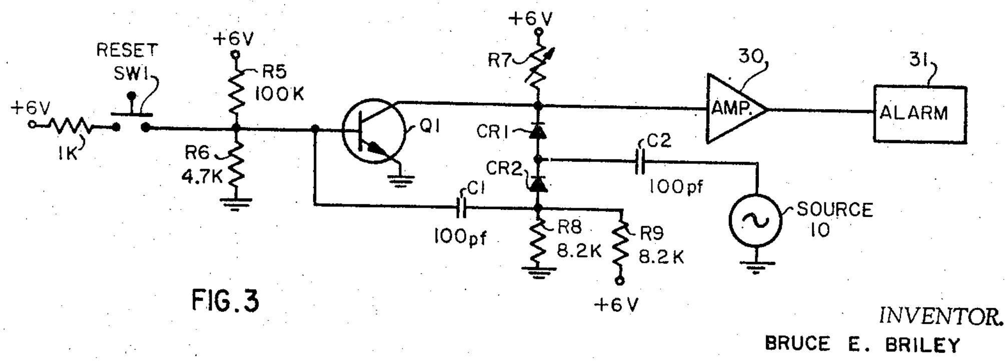

FIG. 3 is a schematic of a radiation detector circuit including a flip-flop arrangement similar to FIG. 1.

FIG. 1 illustrates the one transistor flip-flop with an NPN transistor, Q1, having an emitter at ground, a base 2*a*, 2*d*, and a collector 2*b*, 2*e*. The base is connected to a variable resistor R1, capacitor C1, and an ON-OFF control. The collector is connected to one side of R2, diode CR1 and the output terminal. R1 is connected on one end to a voltage of +6 v., and on the other end to a voltage of −6 v. The other side of R2 is connected to +6 v. C2 is connected between the junction of diodes CR1 and CR2 and a sinusoidal signal source. R3 is connected on one side to the junction of R4, CR2 and C1, and on the other side to ground. The other side of R4 is connected to +6 v.

With reference to the circuit in FIG. 1, the first state occurs when the collector of Q1 is of sufficient positive voltage to back bias diodes CR1 and CR2. The sinusoidal signal source connected to the junction of CR1 and CR2 does not affect the base voltage because of the high impedance (high resistance and relatively low capacitance) of CR2. Resistor R1, by biasing the transistor to cutoff, maintains the transistor in the first state until a signal applied to the base from the ON-OFF control causes the transistor collector to drop to a value which will forward bias the diodes to conduction. This forward biasing effect could also be accomplished by applying a negative voltage to the collector.

When the diodes are forward biased to conduction, diode CR2 presents a low impedance path (low resistance and relatively large capacitance) to the base for the sinusoidal signals. A positive portion of the sinusoid voltage saturates the transistor, and as the sinusoid goes negative, the transistor is cutoff. The collector of the transistor, instead of rising toward the collector supply voltage during cutoff, follows the base voltage. If the frequency and amplitude of the sinusoid and the collector resistance are properly chosen, the saturation periods will succeed each other in a time less than the delay dictated by the collector resistance for the collector voltage to approach the level of the collector supply, and the collector will remain at an average negative voltage. This constitutes the second state. A negative voltage applied from the ON-OFF signal source to the base or a positive voltage to the collector having enough amplitude to back bias the diode, will change the flip-flop into its other state. Thus, logical gain is secured through a combination of grounded emitter inversion and logical inversion (a decrease in average collector potential increases the sine wave amplitude) by modulating a sinusoid.

Figures 2A, 2B, 2C, 2D, 2E, 2F, 2G, 2H:
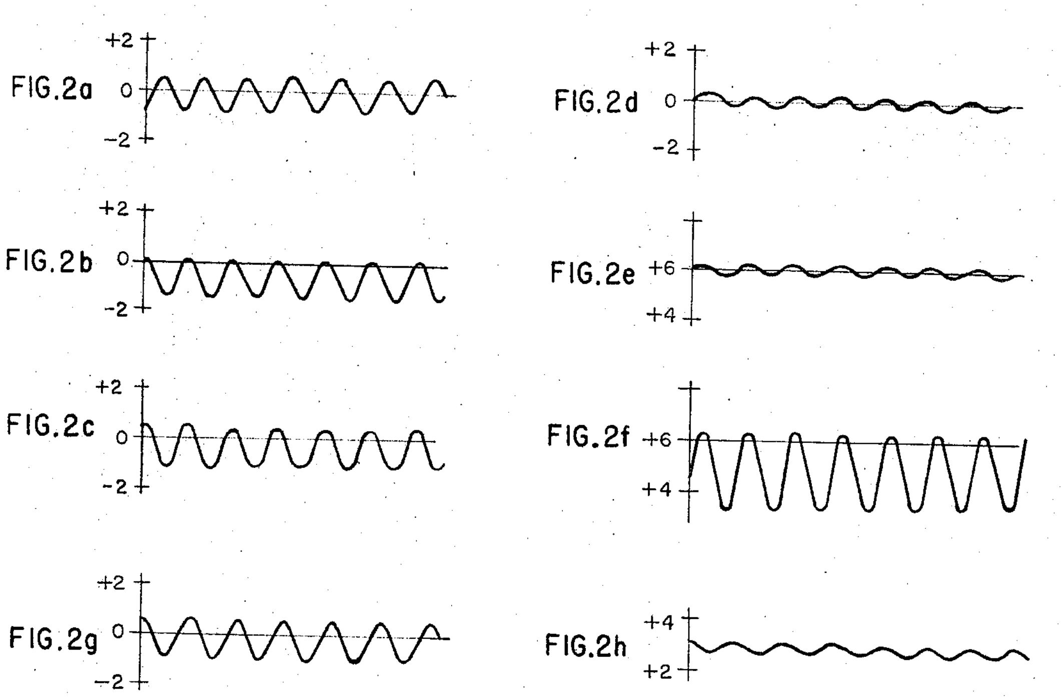

FIGS. 2*a* to 2*h* illustrate the waveforms of the flip-flop of FIG. 1 during its two states. Source 10 is generating sinusoidal signals of ten megacycles in frequency. For the "1" state or completely cutoff state the waveform at the base, collector, the junction or CR1 and CR2, and the junction of CR2, R3, R4, and C1, are shown respectively in FIGS. 2*d*, 2*e*, 2*f* and 2*h*. The sinusoidal wave at the base is shown slightly positive, but is not of sufficient amplitude to turn the transistor on. In FIGS. 2*a*, 2*b*, 2*c* and 2*g*, the waveforms in the "0" state or carrier storage state are illustrated respectively for the base, collector, junction of CR1 and CR2, and the junction of CR2, R3, R4, and C1. FIG. 2*a*, as is seen, is both positive and negative, the positive portion causing saturation, and the negative portion cutting off the transistor. The collector voltage shows more negative peaks than the negative peaks of the base cutoff voltage, which indicates that the collector has not only followed the base, but has gone more negative.

The amplitude of the driving voltage is such that in the "0" state, the signal peaks should not go too much, if at all, beyond the zero voltage level. If the signal drive forces the collector into a voltage level more positive than zero, the circuit could flip into the "1" state due to the positive voltage having a forward biasing effect on the diodes.

If more stability were desired in a flip-flop of the type herein, an emitter follower could be connected between the junction of C1, R1 and the base of Q1. In this manner, the circuit could have a wider range of operation.

The application of the collector following phenomenon of junction type semiconductors depends upon an adequate supply of minority carriers being injected into the transistor when saturated, and stored during cutoff. When saturation occurs, the base current is approximately equal to the emitter current and the collector current is small by comparison. Transistor saturation is a condition in which both the emitter and collector junctions are forward biased. Considering an NPN saturated transistor, the emitter current being heavy, a high level injection of electrons takes place at the emitter-base junction. Since the base region is made physically narrower than the emitter or collector, the electrons flowing through the emitter base barrier will experience a low mortality rate, in that, very few of the total electrons will merge with the holes of the P type base material to form an electron-pair bond. The electrons not combining with the holes of the base will diffuse into the collector. The excess flow of electrons to the collector has a forward biasing effect on the collector-base junctions causing a low net rate of flow of charge which at equilibrium equals the collector current, and is much less than the emitter current.

When the base potential of a saturated junction transistor is rapidly reduced to a level below that of the emitter, the emitter base junction becomes reversed biased while the collector base junction remains forward biased. The collector, if the collector resistance connected between the collector and a positive voltage source is somewhat large will follow the base voltage instead of immediately rising toward the positive external voltage or remain for a time unchanged, because the current necessary to change the collector-base junction potential appreciably is not available. The length of time that the collector potential remains essentially constant is called the delay time or storage time. Delay time results from a large number of minority carriers being stored in the base and collector region of the transistor at the moment when the input current is cutoff. If an NPN transistor is saturated and suddenly cutoff, the electrons would be the excess minority carriers in the base and holes the excess minority carriers in the collector. The carriers affecting storage time require a definite time to be collected which is a function of the degree of saturation. Therefore, the delay could be avoided by biasing the transistor so that it goes from cutoff into an active state rather than saturation. However, in the flip-flop arrangement of FIG. 1, the storage effect of carriers is utilized to bring about the desired result.

When the transistor is cutoff after being saturated, the excess charge in the base and collector is removed by recombination and collector-base current. Thus, the minority carrier storage effect consists of storing charge with a low impedance source, and removing it with a high impedance sink and recombination.

An approximate expression for the charge remaining during the period of collector-base forward bias is:

$$Q = Q_0 e^{-t/\tau'} - \int_0^t i_c dt$$

where $Q_0$ is the total excess charge stored $\tau'$ is the effective lifetime of minority carriers $i_c$ is the collector current.

Since $i_c$ is, to a good approximation, constant during the period of forward bias, $$Q = Q_0 e^{-t/\tau'} - It$$

Of interest is the time $\tau$ necessary to reduce this charge to 0 (zero), satisfying $$0 = Q_0 e^{-\tau/\tau'} - I\tau$$

Noting that the current I is given by $$I=\frac{E+V_u}{R}=\frac{V_0}{R}$$

where $E$=collector supply voltage
$V_u$=undershoot voltage, the following expression may be written relating delay time to collector resistance:

$$R=\frac{V_0}{Q_0}\tau e^{\tau/\tau'}$$

Where $V_0$ is equal to the sum of the collector supply voltage and the undershoot voltage $V_u$ (maximum negative voltage at cutoff for an NPN transistor).

Recognizing that the slope of an exponential is proportional to its initial value, and that recombination will take place throughout the semiconductor, and superposition should not be applied in combining non-linear effects, the following approximations are made to warrant the expression used above for charge remaining during collector forward bias.

(1) Recombination and charge recovery are independent processes.

(2) The ratio of the charge annihilated during recovery to that annihilated during decay is large.

(3) The various decay processes may be lumped into an effective minority-carrier lifetime.

These approximations can be justified on the basis of the following:

(1) It will be seen that this approximation is good for all $\tau$ whenever one effect is much greater than the other; thus, in particular, the expression is correct for either (or trivially, both) effect absent. In addition, the approximation is good for small $\tau/\tau'$ if the effects are of comparable magnitude.

(2) This approximation is reasonable under most conditions, but becomes especially good for low $\tau'$ and/or high extraction current.

(3) This approximation is usual.

Also the charge expression can be shown to be an approximation of that derived by Yohan Cho for a long-base diode in a paper titled, "A Method of Theoretical Analysis of High Speed Junction Diode Logic Circuits," appearing in the October 1963 "IEEE Transactions on Electronic Computers."

As the above equation indicates, a relationship exists between the collector resistance, R and the time $\tau$, necessary to reduce the charge stored in the transistor during saturation to zero. The equation was verified by plotting a curve $\tau$ versus R with values of $\tau$ measured with a scope of the collector voltage waveform during cutoff immediately following saturation; then taking two points from the curve and using the R and $\tau$ values therefrom to provide two equations for $$R=\frac{V_0}{Q_0}\tau e^{\tau/\tau'}$$

in order to solve for the constants $V_0/Q_0$ and $\tau'$; then calculating $\tau$ for given values of R to compare calculated $\tau$ with the $\tau$ of the $\tau$ versus R curve. It was found using transistors 2N1613, 2N1302, 2N706 and 2N2476 that the measured $\tau$ and calculated $\tau$ for each was substantially equivalent. Below are listed the values of constants $V_0/Q_0$ and $\tau$:

| | $V_0/Q_0$ (Ω/sec.) | $\tau'$ (μsec.) |
|---|---|---|
| 2N1613 | 1.51 | 2.63 |
| 2N1302 | 15.92 | 4.2 |
| 2N706 and 2N2476 | 78.0 | 27.3 |

Since $V_0$ is constant for all cases, it can be seen that the list is in order of decreasing $Q_0$, but increasing $\tau'$; in view of the increasing order of speed, the former result was expected and the latter unexpected.

In the table below the R and $\tau$ relationship is indicated. Both $\tau$ measured and $\tau$ calculated are shown.

| R | 2N1613 | | 2N1302 | | 2N706 and 2N2476 | |
|---|---|---|---|---|---|---|
| | $\tau$ meas., μsec. | $\tau$ cal., μsec. | $\tau$ meas., μsec. | $\tau$ cal., μsec. | $\tau$ meas., μsec. | $\tau$ cal., μsec. |
| 47K | 4.9 | 4.9 | 1.8 | 1.9 | .6 | .6 |
| 82K | 5.7 | 5.8 | 2.5 | 2.7 | 1.0 | 1.1 |
| 120K | 6.5 | 6.5 | 3.2 | 3.4 | 1.5 | 1.6 |

The base and collector regions will have minority-carrier lifetimes which will differ because of differences in impurity concentrations and carrier type. Since the resistivity of the collector region is considerably greater than that of the base, the lifetime of minority carriers will, in general, be greater in the collector than in the base. Based upon this, the following conjecture will be advanced: in a 2N1613, the majority of excess charge storage is in the base region, while in the 2N706 and 2N2476, it is in the collector. It should be noted that each of the above types used was a planar, double-diffused epitaxial silicon transistor. The 2N1302 was an alloy-junction germanium transistor.

Applying the above to the circuit of FIG. 1, a common emitter transistor with a somewhat large collector resistor will follow the base voltage when it is brought from a state of saturation to a cutoff condition for a period of time until it reduces the charge stored during saturation. This delay due to the storage is recallable in the sense that no output change will occur following an input voltage drop (NPN transistor) if an input rise intervenes before the delay time has elapsed.

Delays from 1 to 10 μs. with a 2N1613 and .03 to 1.1 μs. with a 2N706, and intermediate ranges with other transistors are easily obtainable.

The upper limit on delay is set by the leakage current, which for high collector R, becomes an appreciable part of the collector current.

The delay time of a flip-flop is a factor which controls the allowable frequency range of the frequency source used to saturate and cutoff the transistor, for maintaining the transistor at a negative equilibrium value (NPN) of its second state.

A quantitative discussion of the flip-flop of FIG. 1 will be given. Let the bias be set such that the conduction angle is $\theta$. Then the following inequality hold approximately:

$$R\geq\frac{R'}{f}(1-\theta/2\pi)e^{\frac{(1-\theta/2\pi)}{f\tau'}}$$

where $R$=collector resistance
$R'=V_0/Q_0$ Ω/sec.
$Q$=total charge stored
$\tau'$=effective minority carrier lifetime
$V_0=E+V_u$; $E$=collector supply; $V_u$=the undershoot voltage
$f$=frequency of the sine wave It can be seen that R can be made quite small for large $f$.

The limiting value for $\theta$ is clearly $\pi$, for which $$R\geq\frac{R'}{2f}e^{1/2f\tau'}\approx\frac{R'}{2f}\text{ for large }f\,(>1\text{ Mc.})$$

Then $$f\geq\frac{R'}{2R}$$

is a lower bound on $f$.

This bound is optimistic in that the limit of $\theta=\pi$ can only obtain for 100% modulation, and pessimistic in that no circuit may still act as a flip-flop for $f$ less than the stated value, but the levels of the lowest one and highest zero potential will tend to approach each other.

The minimum or lower bound on $f$ can be calculated by letting $\theta$ go to zero. Then $$f\geq\frac{R'}{R}\text{ holds}$$

This is the most pessimistic limitation, yielding a value above which operation is guaranteed provided that bias point allows finite conduction.

The frequency of the sine wave source is not critical so long as it remains above the minimum value. Thus, an inexpensive oscillaor without crystal control could be used.

The role of the sine wave is one of sustenance; the speed with which the flip-flop's state may be changed should be nearly independent of the sine wave frequency.

It might be mentioned in passing that all components in the flip-flop would yield to integrated circuit techniques.

It will be noted that in the down state or "0" state the average collector voltage never rises as high as ground; thus, other conventional switching circuits may be driven without "climb down" bleeders or diodes.

The fanout capability of one of these flip-flops is of interest. From the considerations discussed above, fanout current in the downstate is given by:

$$I_0=\frac{Q_0e^{-\tau/\tau'}}{\tau}-\frac{V_0}{R}$$

$I_0$ max. will obtain for $\tau$ min. and R max.; let $R\rightarrow\infty$, and $\tau=\tau$ min.$=\frac{1}{2}f$, then $I_0$ max.$=2Q_0fe^{-\frac{1}{2}f\tau_1}\approx 2Q_0f$. A more realistic condition would be that of symmetrical fanout, i.e. $I_0=V_0/R$. Then $$I_0\text{ sym}\approx Q_0f.$$

Thus, fanout is proportional to excess stored charge and to sine-wave frequency

*Radiation detector*

The flip-flop circuit herein could be used as a radiation detector since the operation of the flip-flop is sensitive to minority carrier lifetime, and it could be made to change state by reducing that lifetime.

Neutron bombardment has the effect of producing recombination centers which lower effective minority carrier lifetime. The effect may be written:

$$\tau'\approx\frac{\tau_0}{1+b\phi\tau_0}$$

where $\tau'$=instantaneous effective minority carrier lifetime
$\tau_0$=initial effective minority carrier lifetime
$\phi$=integrated neutron flux If the bias is carefully set, and the sine wave source maintained at constant amplitude, the conduction angle will remain constant. Let $\theta=2k\pi$, $0\leqq k\leqq\frac{1}{2}$.

Then:

$$R\geq R'\left(\frac{1-k}{f}\right)e^{\frac{(1-k)(1+b\phi\tau_0)}{f\tau_0}}$$

If $f$ is maintained constant, $1-k/f$ is a constant K.

Then:

$$R\geq R'Ke^{K/\tau_0}e^{Kb\phi}$$

$$\geq K'e^{Kb\phi}\text{ where }K'=R'Ke^{K/\tau_0}$$

(Actually, for $f>1$ mc., $e^{K/\tau_0}\approx 1$.)

If the collector resistor is varied until the flip-flop can no longer maintain its negative (for NPN) state, then equality will hold:

$$R=K'e^{Kb\phi}$$

$\phi$ could then be easily calculated or read off a graph or a calibrated R dial.

R could also be set at a value corresponding to a critical value of $\phi$, the flip-flop set in its negative (for NPN) state, and then, when the critical value of $\phi$ was reached, the flip-flop would change state and set off an alarm.

With reference to FIG. 3, a radiation detector circuit will be described. The detector circuit includes a flip-flop arrangement similar to FIG. 1.

A transistor Q1 is grounded at the emitter. The base is connected to the junction of C1, R5, and R6, and a non-locking switch SW1; the other side of R5 going to the +6 v. supply and the other side of R6 being grounded. The collector of Q1 is connected to variable resistor R7, diode CR1 and amplifier 30; the other end of R7 going to the +6 v. supply and the other end of amplifier 30 tied to alarm 31. Capacitor C2 is connected between variable sinusoidal signal source 10 and the junction of CR1 and CR2. R9 is connected between the +6 volt supply and the junction of CR2, C1 and R8; the opposite side of R8 being grounded.

The first flip-flop state is when the transistor is cutoff. Resistors R5 and R6 are set so that when the supply voltage is turned on the transistor is biased off. In the state, diodes CR1 and CR2 will be reversed biased, thereby blocking the sinusoidal signals from the input.

When the non-locking switch, SW1, is placed in the reset position, the detector will be in its normal operating position or in the second flip-flop state. In the second state, the collector voltage forward biases CR1 and CR2 to conduction and thereby provides a path for the sinusoidal signals to the transistor input. Variable resistor R7 is adjusted so that the flip-flop will change state when a particular value of integrated neutron flux has impinged upon the device. The alarming means responds to the changes from the normal state to the first state to indicate a value of integrated flux which is above or equal to the particular value to which the circuit was preset.

The circuit shown does not return to the normal state if the neutron source having said particular value of integrated flux is removed. The transistor becomes permanently effected by the field, and is to be replaced or could be used for a field strength greater than it was previously set to detect. For the latter, switch SW1 is manually used to reset the circuit to the normal or zero condition, and resistor R7 is adjusted for the greater level of integrated flux.

To determine the original setting of R7, an external neutron test source could be used on one of a group of transistors having approximately the same minority carrier lifetime. The change of collector voltage due to neutron field strength is used to determine the R7 setting for transistors of the same minority carrier lifetime. The transistor so used for this determination, as was stated above, becomes permanently changed by the neutron field.

In order for a radiation detector of the kind discussed herein to apply to radiation other than neutrons, such radiation must be able to shorten minority carrier lifetime of junction transistor or similar type semiconductors.

While the present invention has been described with respect to particular embodiments, this description is intended in no way to limit the scope of the invention.

What is claimed is:

1. A bistable flip-flop circuit comprising:

an amplifying circuit including a transistor having a base, collector and emitter, said transistor being connected in grounded emitter configuration and having minority carrier storage capability;

signal input connections to said transistor for momentarily applying predetermined first and second signals which respectively initiate a change of state of said transistor from cutoff to conduction and vice versa;

a sinusoidal signal source;

first D.C. biasing means permanently connected to said collector;

said amplifying circuit including a semiconductor gate connected to said first biasing means and interposed between said signal source and said base, said biasing means normally biasing said gate to be open;

said gate being closed in response to the transistor assuming said conducting state upon application of said first momentary signal to effectively connect said source to said base, and said transistor thereupon being maintained in said conducting state due to the injection into said transistor of minority carriers in response to said connection of said source to said base;

and second D.C. biasing means permanently connected to said transistor and effective in response to said transistor assuming said cutoff state upon application of said second momentary signal to maintain said transistor in said cutoff state.

2. A bistable flip-flop circuit as claimed in claim 1 wherein said signal input connections are made to the base of said transistor.

3. A bistable flip-flop circuit as claimed in claim 1 wherein said semiconductor gate includes a pair of series connected diodes and wherein said sinusoidal signal source is connected at a point between said diodes.

4. A bistable device for detecting neutron flux radiation comprising:

a transistor having a base, emitter and collector, said transistor being connected in grounded emitter configuration and having minority carrier storage capability;

switch means connected to said transistor and momentarily operated for initiating a change of state of said transistor from cutoff to conduction;

gate means connected to said transistor;

a sinusoidal signal source effectively connected to the base of said transistor by said gate means in response to the transistor assuming said conducting state for injecting sufficient minority carriers into said transistor to maintain said transistor in said conducting state;

resistive means connected to said collector and dimensioned so that said transistor, upon being exposed to a predetermined amount of neutron flux, changes from said conducting state to said cutoff state;

indicating means connected to said collector and operated in response to said change of the transistor from said conducting state to said cutoff state; and a D.C. biasing source connected to the base of said transistor and effective in response to said transistor assuming said cutoff state, to maintain said transistor in said cutoff state even after said transistor is no longer exposed to said flux.

References Cited

UNITED STATES PATENTS

| | | | |
|---|---|---|---|
| 3,070,779 | 12/1962 | Logue | 307—88.5 |
| 3,131,309 | 4/1964 | Blocher | 307—88.5 |
| 3,144,563 | 8/1964 | Cohler et al. | 307—88.5 |

J. S. HEYMAN, *Primary Examiner.*

JOHN ZAZWORSKY, *Assistant Examiner.*